United States Patent
Bandic et al.

(10) Patent No.: US 9,892,793 B1
(45) Date of Patent: Feb. 13, 2018

(54) SYSTEMS AND METHODS FOR PROGRAMMING DATA TO STORAGE DEVICES

(71) Applicant: HGST Netherlands B.V., Amsterdam (NL)

(72) Inventors: Zvonimir Bandic, San Jose, CA (US); Minghai Qin, San Jose, CA (US); Seung-Hwan Song, San Jose, CA (US); Chao Sun, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/219,220

(22) Filed: Jul. 25, 2016

(51) Int. Cl.
  *G11C 16/12* (2006.01)
  *G11C 16/04* (2006.01)

(52) U.S. Cl.
  CPC .......... *G11C 16/12* (2013.01); *G11C 16/0408* (2013.01)

(58) Field of Classification Search
  CPC .................... G11C 16/12; G11C 16/0408
  See application file for complete search history.

(56) References Cited

U.S. PATENT DOCUMENTS

| 8,874,994 | B2 | 10/2014 | Sharon et al. |
| 9,123,422 | B2 | 9/2015 | Yu et al. |
| 9,136,011 | B2 | 9/2015 | Weathers et al. |
| 2013/0031430 | A1 | 1/2013 | Sharon |
| 2014/0059406 | A1 | 2/2014 | Hyun et al. |
| 2016/0203049 | A1* | 7/2016 | Kim ............... G11C 29/42 714/721 |

OTHER PUBLICATIONS

Yaakobi, et al., "Rewriting Codes for Flash Memories," IEEE Transactions on Information Theory, Feb. 2014, vol. 60, No. 2, pp. 964-975.

Eyal En Gad, et al., "Rank-Modulation Rewrite Coding for Flash Memories," Dec. 2013, retrieved from https://www.researchgate.net/publication/259106151_Rank-Modulation_Rewrit_Coding_for_Flash_Memories, 25 pages.

Jiang, "Making Error Correcting Codes Work for Flash Memory, Part III: New Coding Methods," Tutorial at Flash Memory Summit, Aug. 2014, retrieved from http://www.flashmemorysummit.com/English/Collaterals/Proceedings/2014/20140804_SeminarA_Jiang.pdf, 85 pages.

* cited by examiner

*Primary Examiner* — Tri Hoang
(74) *Attorney, Agent, or Firm* — McDermott Will & Emery LLP

(57) ABSTRACT

Receiving one or more first write commands to write a first set of data to a storage device. The first set of data is programmed in a plurality of memory cells in the storage device using a first plurality of program levels available in the plurality of memory cells. One or more second write commands to write a second set of data to the storage device is received. The second set of data is programmed in the plurality of memory cells with which the first set of data is programmed. The second set of data is programmed using a second plurality of program levels available in the plurality of memory cells different from the first plurality of program levels. Each program level of the first and second pluralities of program levels is mapped to a respective bit pattern comprising three bits.

19 Claims, 4 Drawing Sheets

|  | E | P1 | P2 | P3 | P4 | P5 | P6 | P7 |
|---|---|---|---|---|---|---|---|---|
| Upper Page | 1 | 1 | 0 | 0 | 0 | 0 | 1 | 1 |
| Middle Page | 1 | 0 | 0 | 1 | 1 | 0 | 0 | 1 |
| Lower Page | 1 | 1 | 1 | 1 | 0 | 0 | 0 | 0 |

FIG. 3

SYSTEMS AND METHODS FOR PROGRAMMING DATA TO STORAGE DEVICES

BACKGROUND

The present disclosure relates to storage devices, such as flash memory storage devices, and in particular to programming data to storage devices. Flash memory can tolerate a limited number of program-erase cycles before error rates exceed error correction capacity. Accordingly, frequently written data or other types of data storage behavior that trigger erase operations can shorten the useful lifetime of a flash memory storage device.

SUMMARY

Aspects of the subject technology relate to a method for storing data in storage devices. The method may include receiving one or more first write commands to write a first set of data to a storage device and programming the first set of data in a plurality of memory cells in the storage device using a first plurality of program levels available in the plurality of memory cells. The method may further include receiving one or more second write commands to write a second set of data to the storage device and programming the second set of data in the plurality of memory cells programmed with the first set of data. The second set of data is programmed using a second plurality of program levels available in the plurality of memory cells different from the first plurality of program levels. Each program level of the first and second pluralities of program levels is mapped to a respective bit pattern includes three bits. First and second bit pairs of the bit patterns mapped to the first plurality of program levels are unique across the first plurality of program levels. First and second bit pairs of the bit patterns mapped to the second plurality of program levels are unique across the second plurality of program levels.

In certain aspects, the subject technology also relates to a data storage system including a plurality of storage devices, each storage device includes a plurality of multi-level cells, and a controller coupled to the plurality of storage devices. The controller may be configured to receive one or more first write commands to write a first set of data to the plurality of storage devices and program the first set of data in the plurality of storage devices using a first plurality of program levels available in the plurality of storage devices. The controller may further be configured to receive a second write command to write a second set of data to the storage device and program the second set of data in the plurality of storage devices programmed with the first set of data, wherein the second set of data is programmed using a second plurality of program levels available in the plurality of storage devices different from the first plurality of program levels. Each program level of the first and second pluralities of program levels is mapped to a bit pattern comprising three bits. First and second bit pairs of the bit patterns mapped to the first plurality of program levels are unique across the first plurality of program levels. First and second bit pairs of the bit patterns mapped to the second plurality of program levels are unique across the second plurality of program levels.

Aspects of the subject technology also relate to a machine-readable media encoded with executable instructions which, when executed by a processor, cause the processor to perform operations. The operations include receiving one or more first write commands to write a first set of data to a storage device, and programming the first set of data in a plurality of memory cells in the storage device using a first plurality of program levels available in the plurality of memory cells, and setting a flag upon programming the plurality of memory cells using the first plurality of program levels. Each program level of the first plurality of program levels mapped to a bit pattern comprising three bits. First and second bit pairs of the bit patterns mapped to the first plurality of program levels are unique across the first plurality of program levels.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

BRIEF DESCRIPTION OF THE DRAWINGS

FIG. 3 depicts an example bit-mapping for a data storage system according to aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent that the subject technology may be practiced without these specific details. In some instances, structures and components are shown in block diagram form in order to avoid obscuring the concepts of the subject technology. Like components are labeled with identical element numbers for ease of understanding.

Flash memory is made up of blocks; each block may include multiple pages of memory cells for storing data. Flash memory programs data in units of pages, but erases data in units of blocks. Flash memory can endure a limited number of program-erase cycles before error rates exceed error correction capacity. However, multi-level cell (MLC) flash memory typically can endure fewer program-erase cycles than single-level cell (SLC) flash memory, thus resulting in MLC flash memory with multi-level cell structures often having shorter lifetimes than SLC flash memory. The subject technology enhances the lifetime of storage devices, such as flash memory storage devices, by using rewriting schemes to allow multiple programming operations to be performed on flash memory before requiring an erase operation and to reduce read latency by utilizing a unique bit mapping with the rewriting schemes.

As will be described in more detail below, performing multiple programming operations before erasure in a storage device includes, for example, programming a first set of data to memory cells using a first subset of program levels and programming a second set of data to the same memory cells using a second subset of program levels different from the first subset of program levels.

Figure 1:
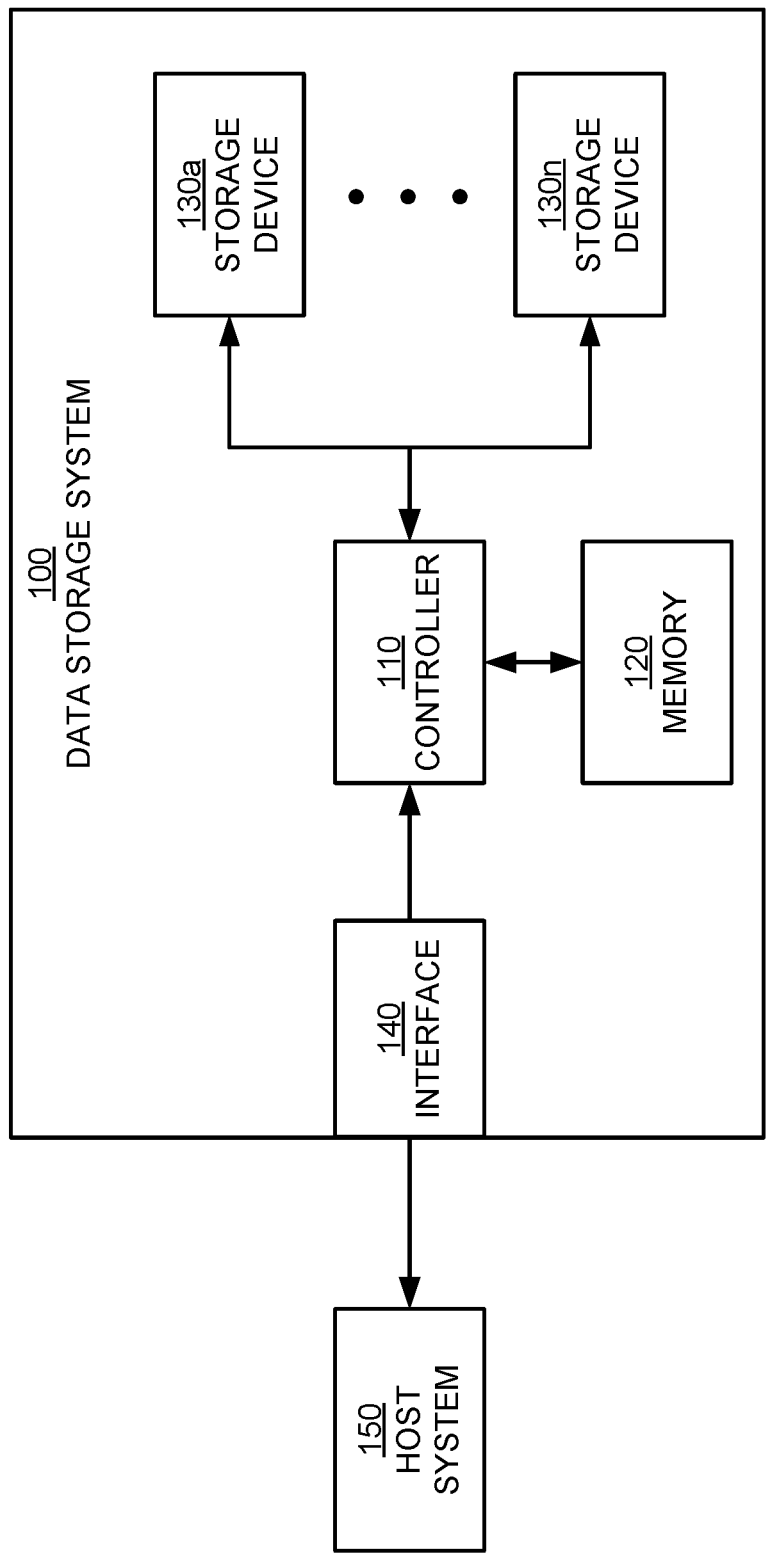
FIG. 1 is a block diagram depicting components of a data storage system according to aspects of the subject technology.

FIG. 1 is a block diagram depicting components of an example data storage system 100 according to various implementations of the subject technology. Data storage system 100 (for example, a solid state drive) may include a controller 110, a memory 120, storage devices 130a-130n, and interface 140. Controller 110 may use memory 120 for temporary storage of data and information used to manage data storage system 100. Controller 110 may include several internal components (not shown) such as one or more processors, read-only memory (ROM), a flash component interface (for example, a multiplexer to manage instruction and data transport along a connection to storage devices 130a-130n), an I/O interface, error correction code (ECC) module, and the like. The ECC module may be configured to generate code words to be stored in the storage devices 130a-130n from data received from host system 150 and to decode code words read from one or more storage devices 130a-130n before sending the decoded data to the host system 150. Various ECC solutions may be used to encode and decode data to generate the code words. In some aspects, one or more elements of controller 110 may be integrated into a single chip. In other aspects, the elements may be implemented on multiple discrete components.

Controller 110, using one or more processors for example, may be configured to execute code or instructions to perform the operations and functionality described herein, manage request flow and address mappings, and to perform calculations and generate commands. The one or more processors of controller 110 may be configured to monitor and control the operation of the components in the controller 110 and data storage system 100. The one or more processors may include a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing.

One or more sequences of instructions may be stored as firmware on ROM within controller 110. One or more sequences of instructions may be stored and read from memory 120, storage devices 130a-130n, or received from host system 150 (for example, via a host interface 140). ROM, memory 120, storage devices 130a-130n, represent examples of machine or computer readable media on which instructions/code executable by controller 110 may be stored. Machine or computer readable media may generally refer to any tangible and/or non-transitory media used to provide instructions to controller 110 and/or its processor, including both volatile media, such as dynamic memory used for memory 120 or for buffers within controller 110, and non-volatile media, such as electronic media, optical media, and magnetic media.

The data storage system 100 may further include a host interface 140. Host interface 140 may be configured to be coupled to host system 150, to receive data from and send data to host system 150. Host interface 140 may include both electrical and physical connections for operably coupling host system 150 to controller 110. Host interface 140 may be configured to communicate data, addresses, and control signals between host system 150 and controller 110. In this manner, controller 110 is configured to store data received from host system 150 in storage devices 130a-130n in response to a write command from host system 150, and to read data stored in storage devices 130a-130n and to transfer the read data to host system 150 via host interface 140 in response to a read command from host system 150. Interface 140 may use any proprietary or standard interface protocols including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe).

According to aspects of the subject technology, host interface 140 may implement a wireless connection between host system 150 and data storage system 100 using standardized or proprietary wireless interface standards and protocols. In this regard, host interface 140 or other components of data storage system 100 may include a wireless transceiver to place host system 150 and data storage system 100 in wireless communication with each other.

Host system 150 represents any device configured to be coupled to data storage system 100 and to store data in data storage system 100. Host system 150 may be a computing system such as a personal computer, a server, a workstation, a laptop computer, PDA, smart phone, and the like. Alternatively, host system 150 may be an electronic device such as a digital camera, a digital audio player, a digital video recorder, and the like. Host system 150 may use logical addressing for data commands sent to data storage system 100. Data storage system 100 may then map logical addresses received from host system 150 to physical addresses of memory locations in storage devices 130a-130n.

In some aspects, memory 120 represents volatile memory used to temporarily store data and information used to manage data storage system 100. According to aspects of the subject technology, memory 120 may be random access memory (RAM) such as double data rate (DDR) RAM. Other types of RAM also may be used to implement memory 120. Memory 120 may be implemented using a single RAM module or multiple RAM modules. While memory 120 is depicted as being distinct from controller 110, those skilled in the art will recognize that memory 120 may be incorporated into controller 110 without departing from the scope of the present disclosure. Alternatively, memory 120 may be a non-volatile memory such as a magnetic disk, flash memory, peripheral SSD, and the like.

Storage devices 130a-130n represent non-volatile memory devices for storing data. According to aspects of the subject technology, storage devices 130a-130n include, for example, NAND flash memory. The NAND flash memory may be organized into pages and blocks. Each of the blocks in the NAND flash memory may include a number of pages, for example 256, and each of the pages may contain one or more sectors or portions of data. The number of storage devices 130a-130n may be any number such as two, four, eight, sixteen, etc. Alternatively, data storage system 100 may be implemented with a single storage device 130. Storage devices 130a-130n may each include a single flash memory device or chip, or may include multiple flash memory devices or chips arranged in multiple channels. Storage devices 130a-130n are not limited to any particular capacity or configuration. For example, the number of physical blocks, the number of physical pages per physical block, the number of sectors per physical page, and/or the size of the sectors may vary.

Storage devices 130a-130n may comprise multilevel cell (MLC) flash memory and/or three-level cell (TLC) memory. In some aspects the storage devices 130a-130n may further comprise three-dimensional (3D) flash memory. In some aspects, storage devices 130a-130n may comprise one or more hybrid memory devices that can function in one or more of a SLC, MLC or TLC mode. The subject technology is not limited to these types of memory and may be applied to flash memory cells configured and operated using more than three levels (e.g., 4 bits per cell, 5 bits per cell, etc.).

TLC NAND flash memory provides for three bits to be stored per cell by using multiple levels of electrical charge applied to the floating gates of its cells to achieve multiple states of conductivity, each occurring at different voltage thresholds ($V_T$). The TLC NAND cell may be capable of storing one of eight programming levels (levels of charge) per cell, yielding three logical bits of information per cell: the Most Significant Bit (MSB), Central Significant Bit (CSB), and Least Significant Bit (LSB). These three logical bits from the memory cells may make up corresponding upper, middle, and lower pages of a memory block, respectively.

Figure 2:
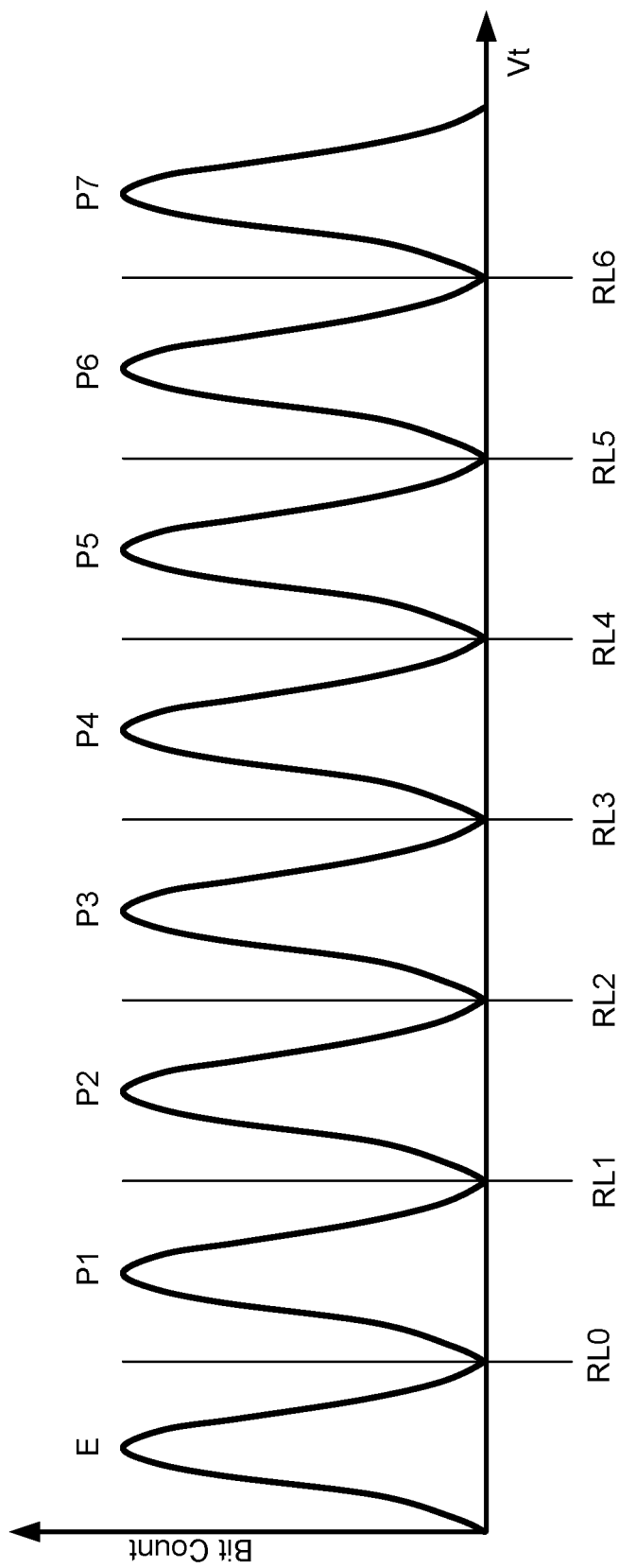
FIG. 2 depicts an example graph showing the relationship between program levels and program level voltages according to aspects of the subject technology.

FIG. 2 includes an example graph 200 of cell distributions among eight program levels of a TLC flash memory that illustrates relationship among bit counts, program levels, and threshold voltages (Vt) as described in more detail below. Graph 200 illustrates the distributions of memory cells among eight program levels: an erase level E; a first program level P1; a second program level P2; a third program level P3; a fourth program level P4; a fifth program level P5; a sixth program level P6; and a seventh program level P7. The threshold voltages are associated with the program levels so that the threshold voltages increase as the program levels increase. With eight program levels, each memory cell can store three logical bits of data: an LSB, a CSB, and an MSB. Data is read from the TLC flash memory using the read level voltages RL0, RL1, RL2, RL3, RL4, RL5, RL6 and RL7 to determine which program level the respective memory cells have been programmed to.

FIG. 3 illustrates an example bit-mapping for a data storage system according to aspects of the subject technology. The bit-mapping includes bit patterns mapped to respective program levels available to program memory cells. For example, the first row of the bit-mapping includes program levels (E-P7) that correspond respectively to eight program levels (E-P7) described in FIG. 2. Further, each program level is mapped to three logical bits forming an upper page, a middle page and a lower page. The controller 110 may use the bit pattern illustrated in the bit-mapping to map each of the program levels in the memory cell. For example, the state "E" in the bit-mapping includes "1" for all upper, middle, and lower pages. As the program level "E" in the bit-mapping corresponds to program level E of the memory cell, the controller 110 may map program level E with a bit pattern of "1 1 1".

Figure 4:
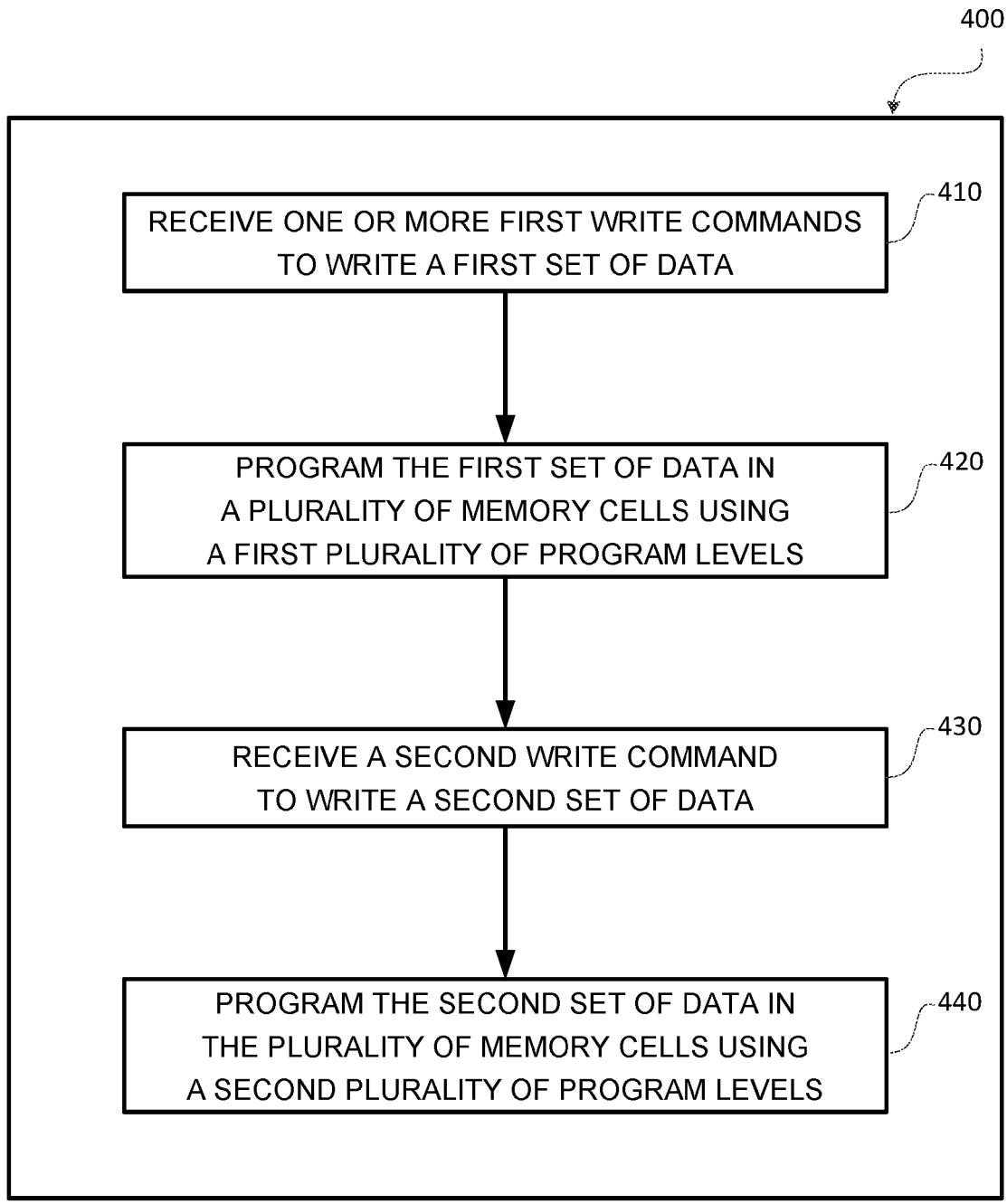
FIG. 4 depicts a flow diagram of an example process for storing data in a data storage system according to aspects of the subject technology.

FIG. 4 depicts a flow diagram of an example process 400 for storing data in a data storage system 100 according to aspects of the subject technology. For explanatory purposes, the various blocks of example process 400 are described herein with reference to the components and/or processes described herein. The one or more of the blocks of process 400 may be implemented, for example, by one or more processors, including, for example, controller 110 of FIG. 1 or one or more components or processors of controller 110.

In some implementations, one or more of the blocks may be implemented apart from other blocks, and by one or more different processors or controllers. Further for explanatory purposes, the blocks of example process 400 are described as occurring in serial, or linearly. However, multiple blocks of example process 400 may occur in parallel. In addition, the blocks of example process 400 need not be performed in the order shown and/or one or more of the blocks of example process 400 need not be performed.

The process 400 begins at block 410 where the controller 110 receives one or more first write commands to write a first set of data in a plurality of memory cells in the storage devices 130. At block 420, the controller 110 programs the first set of data in the plurality of memory cells using a first plurality of program levels. Each of the first plurality of program levels is mapped to a respective bit pattern comprising at least three bits. The first and second bit pairs of the bit patterns mapped to the first plurality of program levels are unique across the first plurality of program levels. The first and second bit pair is used for storing data, and the third bit may be unused.

Referring back to FIGS. 2 and 3, the first set of data may be programmed in the plurality of memory cells using program levels E-P3. The controller 110 may use the bit pattern illustrated in the bit-mapping of FIG. 3 to map each of the program levels E-P3. For example, according to the bit-mapping, program level E is assigned a bit pattern of "1 1 1" where the first bit corresponds to the upper page of the bit-mapping, and the second bit corresponds to the middle page of the bit-mapping, and the third bit corresponds to the lower page of the bit-mapping. Further in accordance to the bit-mapping, program level P1 is assigned a bit pattern of "1 0 1", program level P2 is assigned a bit pattern of "0 0 1", and program level P3 is assigned a bit pattern of "0 1 1". The first and second bit pair, for example, may correspond to the upper page and the middle page of the bit-mapping. That is, the bit patterns mapped to the first plurality of program levels includes "1 1" of program level E, "1 0" of program level P1, "0 0" of program level P2, and "0 1" of program level P3.

Accordingly, the first and second bit pair of bit patterns mapped to the first plurality of program levels are unique across the first plurality of program levels (i.e., program levels E-P3). On the other hand, the third bit of the bit patterns mapped to the first plurality of program levels is uniform across the first plurality of program levels (i.e., all 1's).

In some aspects, the controller 110 may set a flag when a plurality of memory cells is programmed using the first plurality of program levels. For example, the controller 110 may track the availability of pages for a second write operation by setting a flag for respective pages to determine which pages have been written to only once since a last erase operation and therefore are available to be written to for the second time. In some aspects, the flag may be set in a table that the controller 110 manages for all pages in storage devices 103a-130n. The table may be stored in memory 120, in storage devices 103a-130n, or in other locations accessible to controller 110.

Returning to FIG. 4, the process 400 proceeds to block 430 where the controller 110 receives one or more second write commands to write a second set of data in a plurality of memory cells in the storage devices 130. At block 440, the controller 110 programs the second set of data in the plurality of memory cells using a second plurality of program levels. Each of the second plurality of program levels is mapped to a respective bit pattern comprising at least three bits. The first and second bit pairs of the bit patterns mapped to the second plurality of program levels are unique across the first plurality of program levels.

Referring back again to FIGS. 2 and 3, the second set of data may be programmed in the plurality of memory cells using program levels P4-P7. The controller 110 may use the bit pattern illustrated in the bit-mapping of FIG. 3 to map each of the program levels P4-P7. For example, according to the bit-mapping, program level P4 is assigned a bit pattern of "0 1 0" where the first bit corresponds to the upper page of the bit-mapping, and the second bit corresponds to the middle page of the bit-mapping, and the third bit corresponds to the lower page of the bit-mapping. Further in accordance to the bit-mapping, program level P5 is assigned a bit pattern of "0 0 0", program level P6 is assigned a bit pattern of "1 0 0", and program level P7 is assigned a bit pattern of "1 1 0". The first and second bit pair, for example, may correspond to the upper page and the middle page of the bit-mapping. That is, the bit patterns mapped to the second plurality of program levels includes "0 1" of program level P4, "0 0" of program level P5, "1 0" of program level P6, and "1 1" of program level P7. Accordingly, the first and second bit pair of bit patterns mapped to the second plurality of program levels is unique across the second plurality of program levels (i.e., program levels P4-P7). On the other hand, the third bit of the bit patterns mapped to the second plurality of program levels is uniform across the second plurality of program levels (i.e., all 0's).

In some aspects, the controller 110 may determine whether a flag for identifying memory cells available for second write operation has been set for the programmed memory cells. In such a case, after the controller 110 completes programming the second set of data in the plurality of memory cells, the controller may clear the flag. Therefore, with the bit-mapping illustrated in FIG. 3, memory cells can be programmed twice before requiring an erasure operation to be performed to the block.

With the programming scheme described above, the number of times that frequently rewritten data, "hot data," can be updated in a block is higher than the number of times hot data can be updated in a block using conventional programming schemes that only write to memory cells once between erase operations but use all of the available logical bits for storing data in a memory cell.

For example, when storing hot data of size of 24 kilobytes (kB) into TLC flash memory with each block having 128 word lines of 12 kB per word line, the total number of updates performed before the block can no longer be written to is limited to 64 with a conventional programming scheme but 85.33 updates with the programming scheme described herein.

With the conventional programming scheme, storing hot data of size of 24 kB into TLC flash memory would occupy 2 word lines per update where each word line has 12 kB. Accordingly, the total number of updates with the conventional programming scheme would be 64 updates (128 word lines/two word lines per update). On the other hand, with the programming scheme described in the present disclosure, because only two bits out of three available bits are utilized in storing data in a memory cell, eight kB is available per word line instead of 12 kB. In the first cycle of updates, 42.66 updates (128 word lines/three word lines per update) are available. However, because the programming scheme described in the present disclosure allows multiple programming operations to be performed per memory cell, another cycle of updates can be performed to the block before erasure operation is performed. Therefore, the total number of updates would be 85.33 updates (128 word lines/3 word lines per update*two rounds of write operations) which is approximately 1.33 times more than the conventional programming scheme offers. Increasing the number of programming operations before the erasure operation is performed improves the lifetime of flash memory.

Aspects of the subject technology may further provide reduction in read latency. When a read operation is performed in the data storage system 100 in which one or more set of data are programmed using the bit-mapping illustrated in FIG. 3, the average number of reads is 1.5 (three read operations/two bits read), wherein with memory cells programmed using a conventional programming scheme, the average number of read may be 2.33 reads (seven read operations/three bits read). Referring back to FIG. 2, data are read from the plurality of memory cells with reference to read levels (i.e., RL0-6). For example, when reading data from the plurality of memory cells programmed using a first set of program levels (i.e., E-P3), voltage is applied to read levels RL0-RL2. First, read level RL1, which is in between program levels P1 and P2, is read. Then, either read level RL0, which is in between program levels E and P1, or read level RL2, which is in between program levels P2 and P3, is read. This results to three reads in two pages. Accordingly, the average number of reads would be 1.5 reads. Further, the read operation for the second set of program levels that correspond to program levels P4-P7 may be performed in the similar manner as the read operation performed for the first set of program levels.

The subject technology discussed above provides an efficient mechanism for storing data in storage device systems. While the foregoing examples focused on TLC flash memory, the algorithms and underlying principals may be applied to other types of flash memory such as MLC or other types configured to store data using more than three bits, eight levels, and therefore should not be construed to be limited to TLC flash memory.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader).

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an implementation may apply to all aspects, or one or more aspects. An implementation may provide one or more examples. A phrase such as an "embodiment" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method comprising:
   receiving one or more first write commands to write a first set of data to a storage device;
   programming the first set of data in a plurality of memory cells in the storage device using a first plurality of program levels available in the plurality of memory cells, wherein each of the plurality of memory cells is programmed with two bits of data from the first set of data;
   receiving one or more second write commands to write a second set of data to the storage device; and
   programming the second set of data in the plurality of memory cells programmed with the first set of data, wherein the second set of data is programmed using a second plurality of program levels available in the plurality of memory cells, each of the second plurality of program levels is different from each of the first plurality of program levels, and each of the plurality of memory cells is programmed with two bits of data from the second set of data,
   wherein each program level of the first and second pluralities of program levels is mapped to a respective bit pattern comprising three bits,
   wherein first and second bit pairs of the bit patterns mapped to the first plurality of program levels are unique across the first plurality of program levels, and
   wherein first and second bit pairs of the bit patterns mapped to the second plurality of program levels are unique across the second plurality of program levels.

2. The method of claim 1, further comprising:
   setting a flag upon programming the plurality of memory cells using the first plurality of program levels; and
   clearing the flag upon programming the plurality of memory cells using the second plurality of program levels.

3. The method of claim 1, wherein threshold voltages associated with the first plurality of program levels are less than threshold voltages associated with the second plurality of program levels.

4. The method of claim 1, wherein the first bit of the first and second bit pairs corresponds to a first logical page of data and the second bit of the first and second bit pairs corresponds to a second logical page of data.

5. The method of claim 1, wherein a third bit of the bit patterns mapped to the first plurality of program levels is uniform across the first plurality of program levels, and
   wherein the third bit of the bit patterns mapped to the second plurality of program levels is uniform across the second plurality of program levels.

6. The method of claim 5, wherein the third bit corresponds to a third logical page unused for storing data.

7. The method of claim 1, wherein the storage device is a 3D NAND flash memory device.

8. A data storage system, comprising:
   a plurality of storage devices, each storage device comprising a plurality of multi-level cells; and
   a controller coupled to the plurality of storage devices, wherein the controller is configured to:
   receive one or more first write commands to write a first set of data to the plurality of storage devices;
   program the first set of data in the plurality of storage devices using a first plurality of program levels available in the plurality of storage devices, wherein two bits of data from the first set of data are programmed in each multi-level cell programmed in the plurality of storage devices;
   receive a second write command to write a second set of data to the plurality of storage devices; and
   program the second set of data in the plurality of storage devices programmed with the first set of data, wherein the second set of data is programmed using a second plurality of program levels available in the plurality of storage devices, each of the plurality of program levels is different from each of the first plurality of program levels and two bits of data from the second set of data are programmed in each of the multi-level cell programmed in the plurality of storage devices, wherein each program level of the first and second pluralities of program levels is mapped to a bit pattern comprising three bits,
wherein first and second bit pairs of the bit patterns mapped to the first plurality of program levels are unique across the first plurality of program levels, and
wherein first and second bit pairs of the bit patterns mapped to the second plurality of program levels are unique across the second plurality of program levels.

9. The data storage system of claim 8, wherein the controller is further configured to:
set a flag upon programming the plurality of storage devices using the first plurality of program levels; and
clear the flag upon programming the plurality of storage devices using the second plurality of program levels.

10. The data storage system of claim 8, wherein threshold voltages associated with the first plurality of program levels are less than threshold voltages associated with the second plurality of program levels.

11. The data storage system of claim 8, wherein the first bit of the first and second bit pairs corresponds to a first logical page of data and the second bit of the first and second bit pairs corresponds to a second logical page of data.

12. The data storage system of claim 8, wherein a third bit of the bit patterns mapped to the first plurality of program levels is uniform across the first plurality of program levels, and
wherein the third bit of the bit patterns mapped to the second plurality of program levels is uniform across the second plurality of program levels.

13. The data storage system of claim 12, wherein the third bit corresponds to a third logic page unused for storing data.

14. The data storage system of claim 8, wherein the storage device is a flash memory device, the flash memory device has a 3D NAND flash memory structure.

15. A machine-readable media encoded with executable instructions which, when executed by a processor, cause the processor to perform operations comprising:
receiving one or more first write commands to write a first set of data to a storage device;
programming the first set of data in a plurality of memory cells in the storage device using a first plurality of program levels available in the plurality of memory cells, wherein each of the plurality of memory cells is programmed with two bits of data from the first set of data;
setting a flag upon programming the plurality of memory cells using the first plurality of program levels;
receiving a second write command to write a second set of data to the storage device;
programming the second set of data in the plurality of memory cells programmed with the first set of data, wherein the second set of data is programmed using a second plurality of program levels available in the plurality of memory cells different from the first plurality of program levels and each of the plurality of memory cells is programmed with two bits of data from the second set of data; and
clearing the flag upon programming the plurality of memory cells using the second plurality of program levels,
wherein each program level of the first and second pluralities of program levels is mapped to a bit pattern comprising three bits,
wherein first and second bit pairs of the bit patterns mapped to the first plurality of program levels are unique across the first plurality of program levels,
wherein first and second bit pairs of the bit patterns mapped to the second plurality of program levels are unique across the second plurality of program levels.

16. The machine-readable media of claim 15, wherein threshold voltages associated with the first plurality of program levels are less than threshold voltages associated with the second plurality of program levels.

17. The machine-readable media of claim 15, wherein the first bit of the first and second bit pairs corresponds to a first logical page of data and the second bit of the first and second bit pairs corresponds to a second logical page of data.

18. The machine-readable media of claim 15, wherein a third bit of the bit patterns mapped to the first plurality of program levels is uniform across the first plurality of program levels,
wherein the third bit of the bit patterns mapped to the second plurality of program levels are uniform across the second plurality of program levels, and
wherein the third bit corresponds to a third logical page unused for storing data.

19. The machine-readable media of claim 15, wherein the storage device is a flash memory device, the flash memory device has a 3D NAND flash memory structure.

* * * * *